(12) United States Patent
Hati et al.

(10) Patent No.: US 10,050,608 B2
(45) Date of Patent: Aug. 14, 2018

(54) PHASE MODULATION NOISE REDUCER

(71) Applicant: THE UNITED STATES OF AMERICA, AS REPRESENTED BY THE SECRETARY OF COMMERCE, Washington, DC (US)

(72) Inventors: Archita Hati, Boulder, CO (US); Craig Nelson, Boulder, CO (US); David Howe, Louisville, CO (US)

(73) Assignee: THE UNITED STATES OF AMERICA, AS REPRESENTED BY THE SECRETARY OF COMMERCE, Washington, DC (US)

( * ) Notice: Subject to any disclaimer, the term of this patent is extended or adjusted under 35 U.S.C. 154(b) by 218 days.

(21) Appl. No.: 15/189,235

(22) Filed: Jun. 22, 2016

(65) Prior Publication Data

US 2016/0344376 A1    Nov. 24, 2016

Related U.S. Application Data

(62) Division of application No. 14/716,518, filed on May 19, 2015, now Pat. No. 9,407,246.

(51) Int. Cl.
*H03C 1/06* (2006.01)
*H03C 3/04* (2006.01)
(Continued)

(52) U.S. Cl.
CPC ............ *H03K 5/1252* (2013.01); *H03C 1/06* (2013.01); *H03C 3/02* (2013.01); *H03C 3/04* (2013.01);
(Continued)

(58) Field of Classification Search
CPC ...... H03B 2200/0088; H03B 2200/009; H03C 1/06; H03C 3/02; H03C 3/04; H03C 3/08; H03C 5/00; H03K 3/013; H03K 5/1252
(Continued)

(56) References Cited

U.S. PATENT DOCUMENTS 5,940,025 A * 8/1999 Koehnke ............... G01S 7/282
                                                    330/2
7,459,946 B2 * 12/2008 Bollenbeck .......... H03J 7/065
                                                    327/116
(Continued)

OTHER PUBLICATIONS

Howe, D.A. et al., PM-AM Correlation Measurements and Analysis, Proc. 2012 IEEE International Frequency Control Symposium, May 2012, pp. 16-20.
(Continued)

*Primary Examiner* — Levi Gannon
(74) *Attorney, Agent, or Firm* — Office of Chief Counsel for National Institute of Standards and Technology

(57) ABSTRACT

A phase modulation (PM) noise reducer to reduce phase modulation noise of an oscillator, the PM noise reducer including: an amplitude modulation (AM) detector to receive a primary oscillator signal and to produce an AM detector signal based on the primary oscillator signal, the primary oscillator signal including a first phase modulation (PM) noise; a control circuit in electrical communication with the AM detector to receive the AM detector signal and to produce a control signal; a phase shifter in electrical communication with the control circuit to receive the primary oscillator signal and the control signal and to produce a secondary oscillator signal based on the primary oscillator signal and the control signal, the secondary oscillator signal comprising a second PM noise, wherein the second PM noise is less than the first PM noise.

9 Claims, 11 Drawing Sheets

(51) Int. Cl.
  *H03C 5/00*    (2006.01)
  *H03K 5/1252*  (2006.01)
  *H03C 3/02*    (2006.01)
(52) U.S. Cl.
  CPC ......... *H03C 5/00* (2013.01); *H03B 2200/009* (2013.01)
(58) Field of Classification Search
  USPC .................... 332/144–146, 159, 160, 162
  See application file for complete search history.

(56) References Cited

U.S. PATENT DOCUMENTS

| | | | |
|---|---|---|---|
| 7,873,331 B2* | 1/2011 | Woo ................. | H03C 5/00 330/149 |
| 2008/0258831 A1* | 10/2008 | Kunihiro ............ | H03C 5/00 332/103 |
| 2016/0218757 A1* | 7/2016 | Zuckerman .......... | H04B 1/109 |

OTHER PUBLICATIONS

Hati, A. et al., Correlation Measurements between PM and AM Noise in Oscillators, Proceedings 2014 IEEE International Frequency Control Symposium, May 2014.
Hati, A. et al., Reducing oscillator PM noise from AM-PM noise correlation, Electronics Letters, Aug. 14, 2014, pp. 11-95-1197, vol. 50, No. 17.

* cited by examiner

PHASE MODULATION NOISE REDUCER

CROSS REFERENCE TO RELATED APPLICATIONS

This application is a divisional of U.S. application Ser. No. 14/716,518, filed May 19, 2015, the disclosure of which is incorporated herein by reference in its entirety.

STATEMENT REGARDING FEDERALLY SPONSORED RESEARCH

This invention was made with United States government support from the National Institute of Standards and Technology. The government has certain rights in the invention.

BRIEF DESCRIPTION

Disclosed is a phase modulation (PM) noise reducer to reduce phase modulation noise of an oscillator, the PM noise reducer comprising: an amplitude modulation (AM) detector to receive a primary oscillator signal and to produce an AM detector signal based on the primary oscillator signal, the primary oscillator signal comprising a first phase modulation (PM) noise; a control circuit in electrical communication with the AM detector to receive the AM detector signal and to produce a control signal; a phase shifter in electrical communication with the control circuit to receive the primary oscillator signal and the control signal and to produce a secondary oscillator signal based on the primary oscillator signal and the control signal, the secondary oscillator signal comprising a second PM noise, wherein the second PM noise is less than the first PM noise.

Further disclosed is a phase modulation (PM) noise reducer to reduce phase modulation noise of an oscillator, the reducer comprising: an amplitude modulation (AM) detector to receive a primary oscillator signal from an oscillator and to produce an AM detector signal based on the primary oscillator signal, the primary oscillator signal comprising a first phase modulation (PM) noise; and a control circuit in electrical communication with the AM detector to receive the AM detector signal, to produce a control signal, and to communicate the control signal to a phase shifter disposed in the oscillator, wherein the phase shifter is configured to receive the primary oscillator signal and the control signal, and the oscillator is configured to produce a secondary oscillator signal in response to the phase shifter receiving the control signal from the control circuit, the secondary oscillator signal comprising a second PM noise that is less than the first PM noise.

Disclosed also is a process for reducing a phase modulation noise of an oscillator, the process comprising: receiving, by an amplitude modulation (AM) detector, a primary oscillator signal from an oscillator, the primary oscillator signal comprising a first modulation (PM) noise; producing, by the AM detector, an AM detector signal based on the primary oscillator signal; receiving, by a phase modulation (PM) detector, the primary oscillator signal from the oscillator; producing, by the PM detector, a PM detector signal based on the primary oscillator signal; receiving, by a control circuit, the AM detector signal from the AM detector and the PM detector signal from the PM detector; producing, by the control circuit: an AM detector transfer function; a PM detector transfer function; and a control signal from the AM detector transfer function and the PM detector transfer function; receiving, by a phase shifter, the primary oscillator signal and the control signal; and producing, by the phase shifter, a secondary oscillator signal comprising a second PM noise that is less than the first PM noise to reduce the PM noise of the oscillator.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments is presented herein by way of exemplification and not limitation.

It has been discovered that a phase modulation (PM) noise reducer described herein provides reduction of PM noise of an oscillator from correlation between amplitude modulated (AM) noise and PM noise produced by the oscillator. From the PM noise and AM noise, a control signal having substantially equal magnitude and frequency response with an opposite phase as the PM noise is used to reduce PM noise of the oscillator in a feedforward error correction process. Advantageously, the PM noise reducer achieves PM noise reduction of the oscillator when the oscillator is subjected to vibration.

Figure 1:
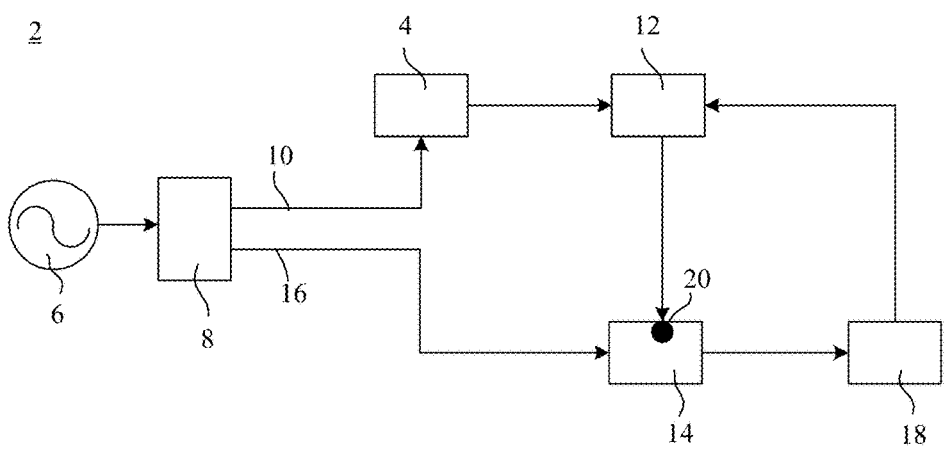
FIG. 1 shows an embodiment of a phase modulation (PM) noise reducer.

In an embodiment, as shown in FIG. 1, phase modulation (PM) noise reducer 2 is configured to reduce phase modulation noise of oscillator 6. PM noise reducer 2 includes amplitude modulation (AM) detector 4 to receive a primary oscillator signal from oscillator 6 and to produce an AM detector signal based on the primary oscillator signal. The primary oscillator signal can include a first PM noise. PM noise reducer 2 also includes control circuit 12 in electrical communication with AM detector 4 to receive the AM detector signal and to produce a control signal. Phase shifter 14 is in electrical communication with control circuit 12 and is configured to receive the primary oscillator signal from splitter 8 and the control signal (at phase shifter control port 20) and to produce a secondary oscillator signal based on the primary oscillator signal and the control signal. Here, the secondary oscillator signal includes a second PM noise that is less than the first PM noise. It should be appreciated that phase shifter 14 is arranged external to oscillator 6. Phase shifter 14 can be, e.g., a voltage variable phase shifter.

Power splitter 8 is interposed between oscillator 6 and AM detector 4 and is in electrical communication with AM detector 4 and phase shifter 14. Power splitter 8 is configured to receive the primary oscillator signal prior to AM detector 4 and phase shifter 14, to split a power of the primary oscillator signal along; and to communicate the primary oscillator signal to AM detector 4 along first line 10 and to phase shifter 14 along second line 16. PM noise reducer 2 also optionally includes PM detector 18 to receive the primary oscillator signal, to produce a PM detector signal in response to receiving the primary oscillator signal, and to communicate the PM detector signal to control circuit 12. In this configuration, control circuit 12 produces the control signal in response to receiving the AM detector signal and the PM detector signal.

Figure 2:
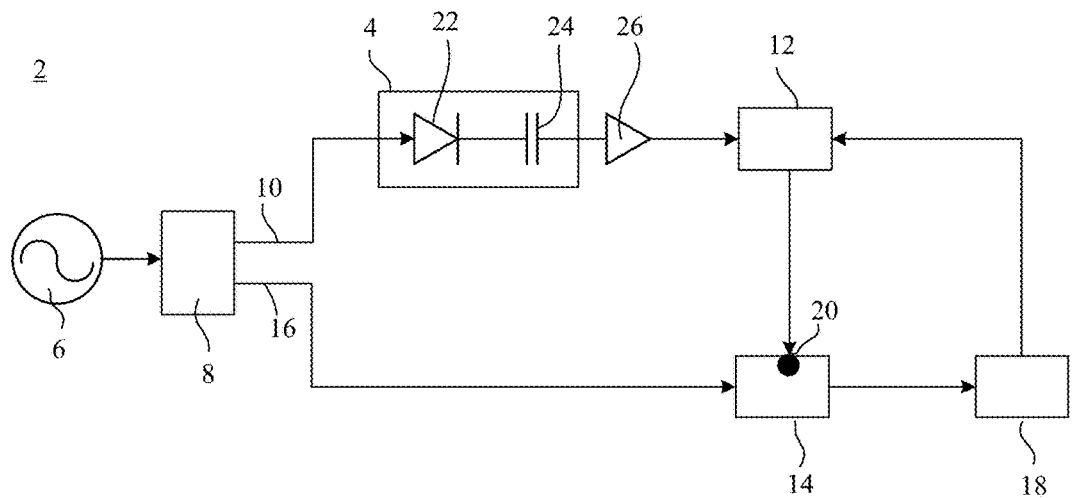
FIG. 2 shows an embodiment of a PM noise reducer.

According to an embodiment, as shown in FIG. 2, AM detector 4 includes diode 22 in electrical communication with power splitter 8 to receive the primary oscillator signal from power splitter 8 and also includes capacitor 24 in electrical communication with diode 22 to provide the AM detector signal to control circuit 12. Additionally, AM detector 4 further includes amplifier 26 in electrical communication with capacitor 24 and interposed capacitor 24 and control circuit 12 to amplify the AM detector signal.

Figure 3:
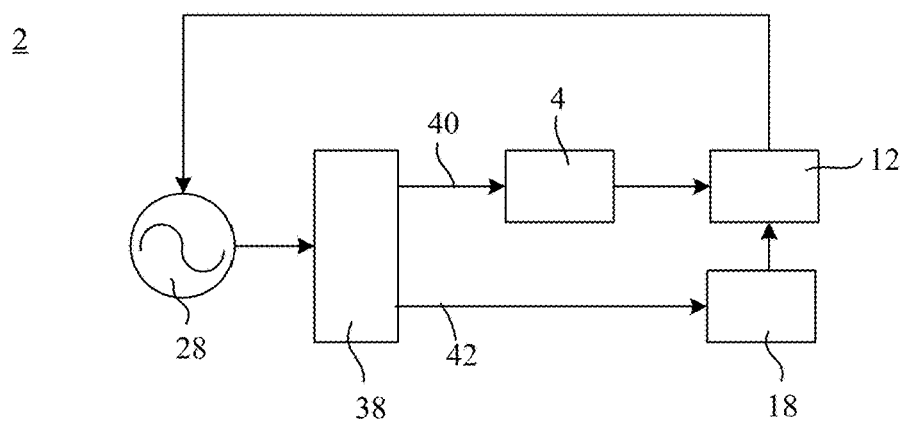
FIG. 3 shows an embodiment of a PM noise reducer.
Figure 4:
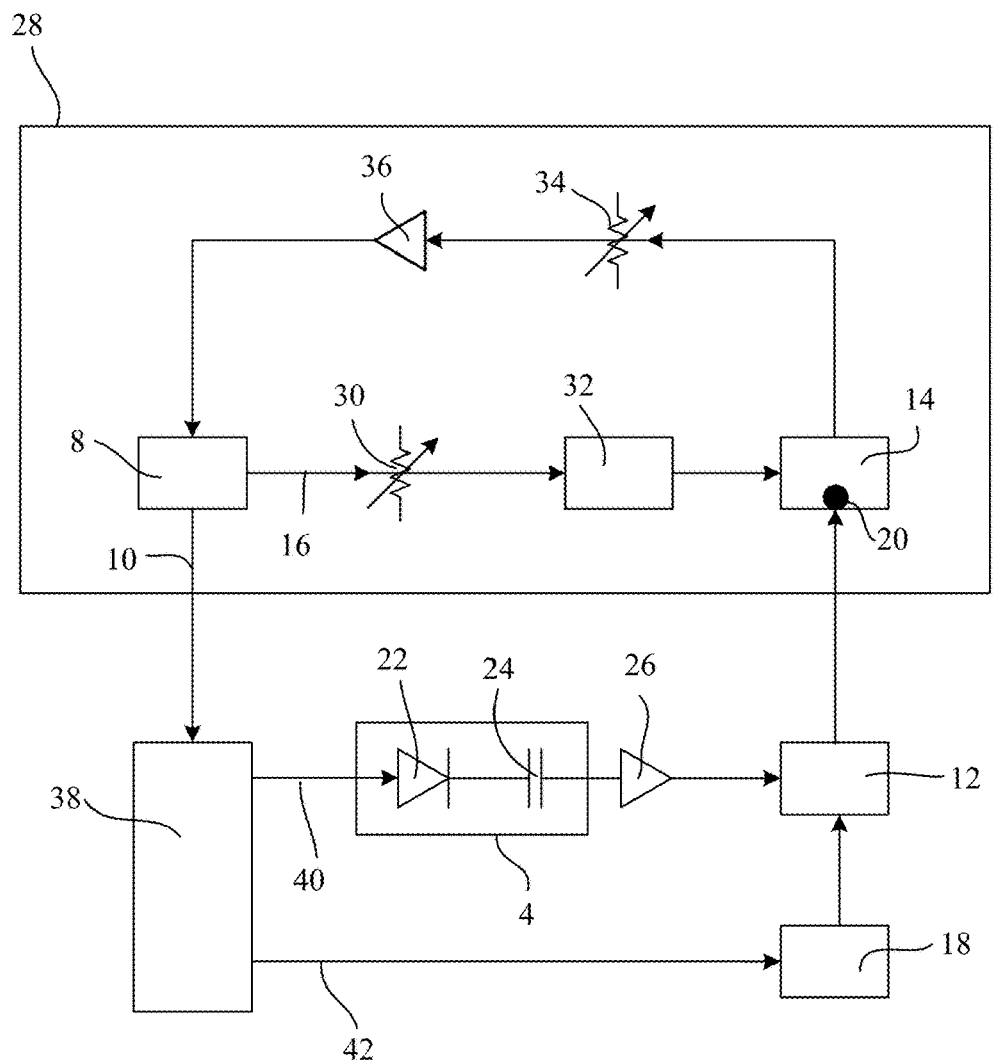
FIG. 4 shows an embodiment of a PM noise reducer.

In an embodiment, with reference to FIG. 3 and FIG. 4, PM noise reducer 2 is configured to reduce phase modulation noise of oscillator 28. Here, PM noise reducer 2 includes AM detector 4 to receive a primary oscillator signal from oscillator 28 and to produce an AM detector signal based on the primary oscillator signal, wherein the primary oscillator signal includes a first PM noise. PM noise reducer 2 also includes control circuit 12 in electrical communication with AM detector 4 to receive the AM detector signal, to produce a control signal, and to communicate the control signal to phase shifter control port 20 of phase shifter 14 that is disposed in oscillator 28. Phase shifter 14 is configured to receive the primary oscillator signal and the control signal, and oscillator 28 is configured to produce a secondary oscillator signal in response to phase shifter 20 receiving the control signal from control circuit 12. It is contemplated that the secondary oscillator signal includes a second PM noise that is less than the first PM noise.

Additionally, PM noise reducer 2 includes PM detector 18 (optionally) and power splitter 38 in electrical communication with AM detector 4 and PM detector 18. Power splitter 38 is configured to receive the primary oscillator signal from oscillator 28 prior to AM detector 4 and PM detector 18, to split a power of the primary oscillator signal, and to communicate the primary oscillator signal to AM detector 4 along third line 40 and to PM detector 18 along fourth line 40. PM detector 18 is configured to receive the primary oscillator signal from power splitter 38, to produce a PM detector signal in response to receiving the primary oscillator signal, and to communicate the PM detector signal to control circuit 12.

AM detector 4 can include diode 22 in electrical communication with power splitter 38 to receive the primary oscillator signal from power splitter 38 and capacitor 24 in electrical communication with diode 22 to provide the AM detector signal to control circuit 12. AM detector 4 can further include amplifier 26 in electrical communication with capacitor 24 and interposed between capacitor 24 and control circuit to 12 amplify the AM detector signal. In this arrangement, control circuit 12 is configured to produce the control signal in response to receiving the AM detector signal and the PM detector signal and to communicate the control signal to phase shifter control port 20 of phase shifter 14 disposed in oscillator 28.

With reference to FIG. 4, in an embodiment, oscillator 28 having phase shifter 14 disposed therein also includes resonator 32 to produce the primary oscillator signal, amplifier 36 to receive the primary oscillator signal or secondary oscillator signal from phase shifter 14 via attenuator 34, and splitter 8 to split the primary oscillator signal between first line 10 and second line 16, and attenuator 32 interposed between resonator 32 and splitter 8 to attenuate the primary oscillator signal.

Figure 5:
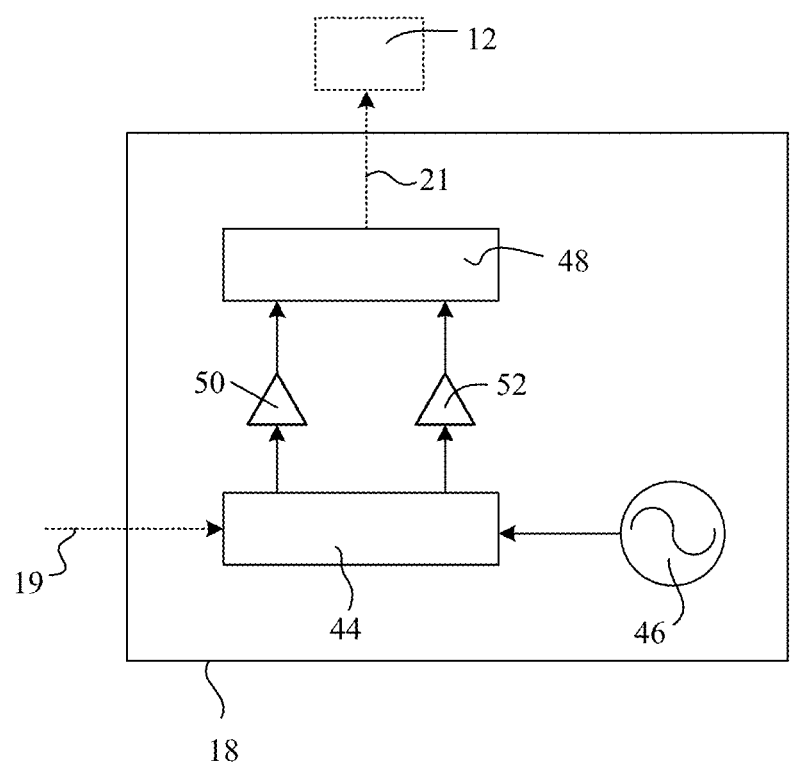
FIG. 5 shows an embodiment of a PM detector.

With reference to FIG. 5, PM detector 18 is in electrical communication with oscillator (e.g., oscillator 6 or oscillator 28) to receive primary oscillator signal 19 and produce PM detector signal 21. According to an embodiment, PM detector 18 includes local oscillator 46 to produce a local oscillator signal, demodulator 44 configured to receive the primary oscillator signal and the local oscillator signal and to produce a demodulator signal, and sampler 48 to receive the demodulator signal from demodulator 44 and to produce PM detector signal 21, which is communicated to control circuit 12. Demodulator 44 can be an I-Q demodulator that produces an in-phase (I) signal that is communicated to amplifier 50 prior to communication to sampler 48 and also produces a quadrature (Q) signal that is communicated to amplifier 52 prior to communication to sampler 48. The in-phase signal and quadrature signal are based on primary oscillator signal 19 and have a phase difference of 90°. In a certain embodiment, sampler 48 is configured to acquire a discreet sample from the in-phase signal and a discreet sample from quadrature signal from demodulator 44. It is contemplated that PM detector 18 can be present in PM noise reducer 2 when PM noise is determined for producing the AM detector transfer function $H_{AM}(f)$ or phase shifter transfer function $H_{PS}(f)$. Thereafter, PM detector 18 can be present but not activated or absent from PM noise reducer 2.

Figure 6:
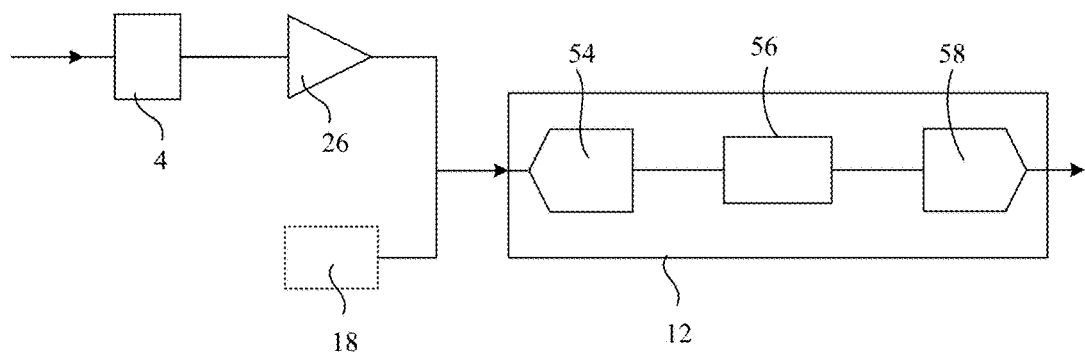
FIG. 6 shows an embodiment of an amplitude modulation detector and control circuit.

It is contemplated that control circuit 12 can be an analog circuit configured to receive an analog signal or a digital signal. Control circuit 12 also can produce the control signal as an analog signal or digital signal. Further, control circuit 12 can process an electrical signal using analog signal processing, digital signal processing, or a combination thereof. In a certain embodiment, as show in FIG. 6, control circuit 12 performs digital signal processing and is in electrical communication with AM detector 4, amplifier 26, phase modulation detector 18, and phase shifter 14 (not shown) disposed external to oscillator 6 (not shown). Here, control circuit 12 includes analog-to-digital converter 54 to receive the AM detector signal and PM detector signal, integrator-digital filter 56 to receive a digital signal from converter 54 and to produce and communicate the control signal to digital-to-analog converter 58. Converter 58 is configured to communicate the control signal to phase shifter 14. In some embodiments, control circuit 12 includes a field programmable gate array that can include filter 56.

Figure 7:
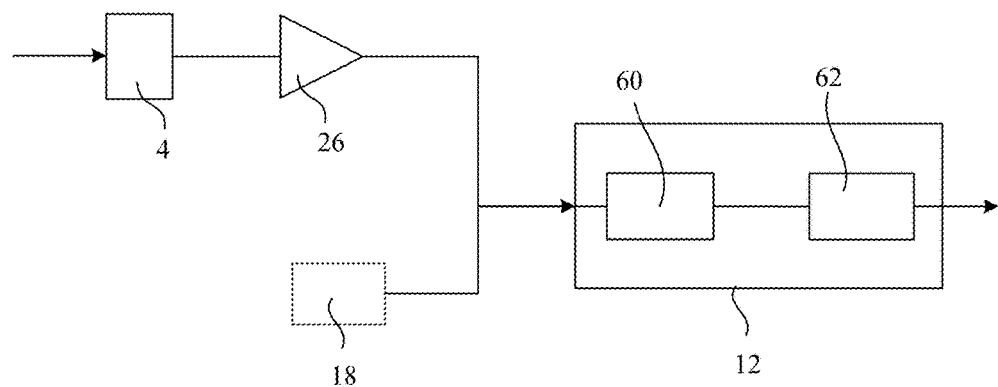
FIG. 7 shows an embodiment of an amplitude modulation detector and control circuit.

According to an embodiment, as show in FIG. 7, control circuit 12 performs analog signal processing and is in electrical communication with AM detector 4, amplifier 26, phase modulation detector 18, and phase shifter 14 (not shown) disposed external to oscillator 6 (not shown). Here, control circuit 12 includes integrator 60 to receive the AM detector signal and PM detector signal, analog filter 62 to receive an analog signal from integrator 60 and to produce and communicate the control signal to phase shifter 14.

Figure 8:
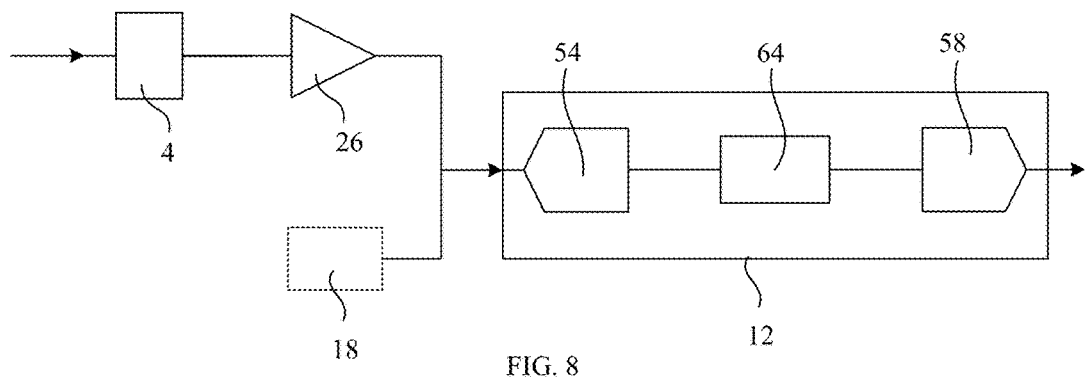
FIG. 8 shows an embodiment of an amplitude modulation detector and control circuit.

In a certain embodiment, as show in FIG. 8, control circuit 12 performs digital signal processing and is in electrical communication with AM detector 4, amplifier 26, phase modulation detector 18, and phase shifter 14 (not shown) disposed in oscillator 28 (not shown). Here, control circuit 12 includes analog-to-digital converter 54 to receive the AM detector signal and PM detector signal, digital filter 64 to receive a digital signal from converter 54 and to produce and communicate the control signal to digital-to-analog converter 58. Converter 58 is configured to communicate the control signal to phase shifter 14 in oscillator 28. In some embodiments, control circuit 12 includes a field programmable gate array that can include filter 64.

Figure 9:
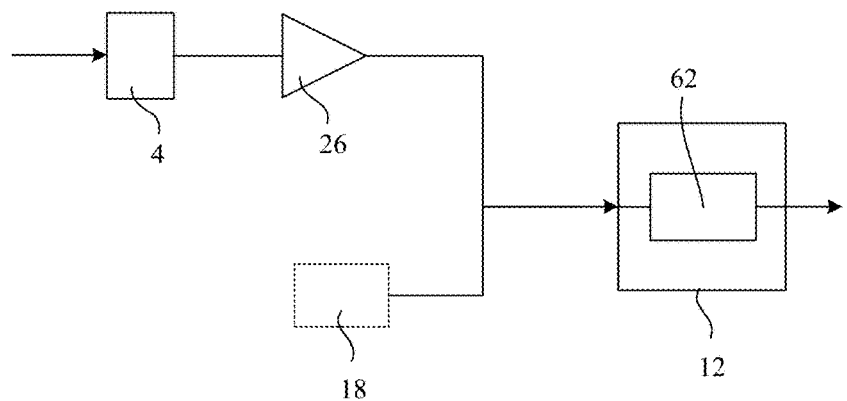
FIG. 9 shows an embodiment of an amplitude modulation detector and control circuit.

According to an embodiment, as show in FIG. 9, control circuit 12 performs analog signal processing and is in electrical communication with AM detector 4, amplifier 26, phase modulation detector 18, and phase shifter 14 (not shown) disposed in oscillator 28 (not shown). Here, control circuit 12 includes analog filter 62 to receive the AM detector signal and PM detector signal and to produce and communicate the control signal to phase shifter 14.

In a certain embodiment, control circuit 12 includes analog-to-digital converter 54 to receive the AM detector signal and the PM detector signal, a field programmable gate array in electrical communication with analog-to-digital converter 54 and including an integrator and a digital filter, and digital-to-analog converter 58 in electrical communication with the field programmable gate array to communicate the control signal to phase shifter 14. According to an embodiment, control circuit 12 is configured to produce an AM detector transfer function that is a result of determination a ratio of the AM detector signal to the PM detector signal, and to produce a phase shifter transfer function, and to produce the control signal that includes a conjugate filter that is a result of a ratio of the AM detector transfer function and the phase shifter transfer function.

In a particular embodiment, control circuit 12 includes integrator 60 to receive the AM detector signal and the PM detector signal, analog filter 62 in electrical communication with integrator 60 to communicate the control signal to phase shifter 14. Control circuit 12 is configured to produce an AM detector transfer function that is a result of a ratio of the AM detector signal to the PM detector signal, to produce a phase shifter transfer function, and to produce the control signal that includes a conjugate filter that is a result of a ratio of the AM detector transfer function and the phase shifter transfer function.

In an embodiment, a process for making PM noise reducer 2 includes connecting splitter 8 to oscillator 6, connecting AM detector 4 and phase shifter 14 to splitter 8, optionally connecting phase shifter 14 to phase modulation detector 18, and connecting control circuit 12 to AM detector 4, phase modulation detector 18 (optionally), and phase shifter control port 20 of phase shifter 14.

According to an embodiment, a process for making PM noise reducer 2 includes connecting splitter 38 to oscillator 28, optionally connecting AM detector 4 and PM detector 18 to splitter 38, connecting control circuit 12 to phase modulation detector 18 (optionally) and AM detector 4 as inputs, and connecting control circuit 12 to phase shifter control port 20 of phase shifter 14 as an output. Here, it is contemplated that PM detector 18 can be present in PM noise reducer 2 when PM noise is determined for producing the AM detector transfer function $H_{AM}(f)$ or phase shifter transfer function $H_{PS}(f)$. Thereafter, PM detector 18 can be present but not activated or absent from PM noise reducer 2.

Figure 10:
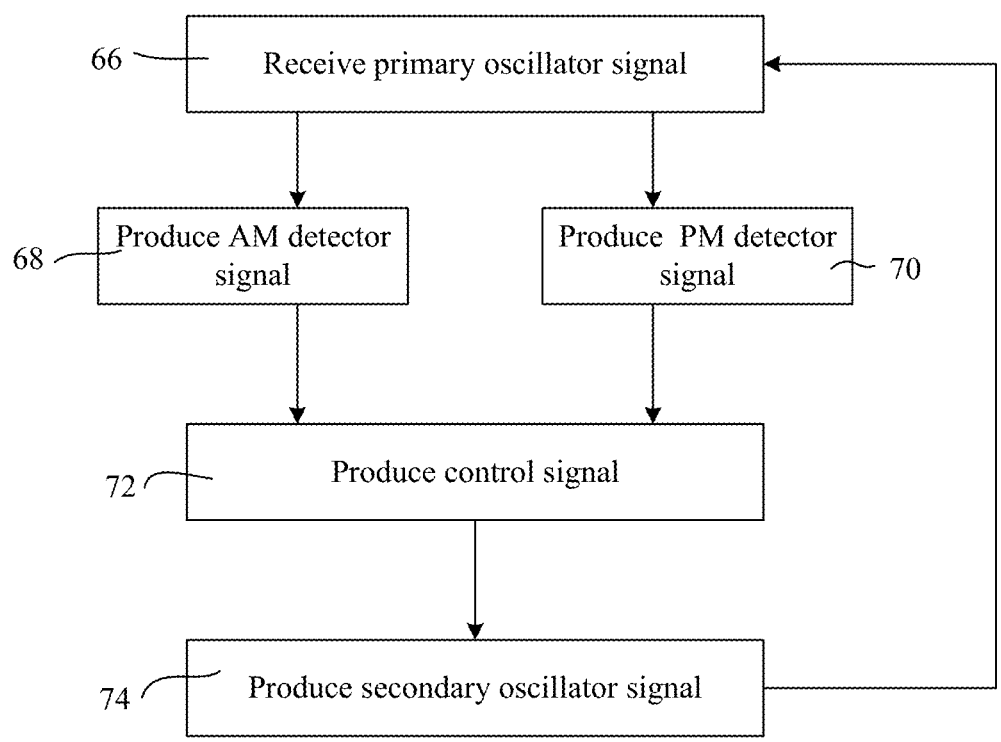
FIG. 10 shows a flowchart of an embodiment for reducing a phase modulation noise.

According to an embodiment, with reference to FIG. 10 a process for reducing a phase modulation noise of an oscillator includes receiving, by AM detector 4, a primary oscillator signal (step 66) from an oscillator (e.g., oscillator 6 or oscillator 28), the primary oscillator signal including a first PM noise; producing, by AM detector 4, an AM detector signal (step 68) based on the primary oscillator signal; receiving, by PM detector 18, the primary oscillator signal from the oscillator; and producing, by PM detector 18, a PM detector signal (step 70) based on the primary oscillator signal; receiving, by control circuit 12, the AM detector signal from AM detector 4 and the PM detector signal from PM detector 18. The process also includes producing, by control circuit 12: an AM detector transfer function, a PM detector transfer function, and a control signal (step 72) from the AM detector transfer function and the PM detector transfer function; receiving, by phase shifter 14, the primary oscillator signal and the control signal; and producing, by phase shifter 14, a secondary oscillator signal (step 74) that includes a second PM noise that is less than the first PM noise to reduce the PM noise of the oscillator.

In a process for determining the control signal, the process includes measuring a double-sideband (DSB) PM noise ($S_\varphi$), AM noise ($S_\alpha$), and cross-power spectral density (CPSD) ($S_{\varphi\alpha}$) between the PM noise and the AM noise. The process also include determining a slope and correlation between the PM noise and the AM noise. Here, correlation between the PM noise and AM noise is correlation coefficient ρ provided in formula 1.

$$\rho = \frac{S_{\varphi\alpha}}{\sqrt{S_\varphi S_\alpha}} \quad (1)$$

where $\sqrt{S_\varphi S_\alpha}$ is a geometric mean of PM noise and AM noise, and ρ has a value from 0 to 1, wherein ρ=1 for 100% correlation between the PM noise and AM noise. Further, control circuit 12 produces the control signal by using the AM noise that is of a substantially same magnitude, substantially same noise slope, and opposite phase as the PM noise. The control signal produced therefrom is used to produce the secondary oscillator signal having the second PM noise that is less than the first PM noise of the oscillator (e.g., oscillator 6 or oscillator 28), wherein the control signal is received by phase shifter 14 in a feed-forward manner to reduce the first PM noise to the second PM noise. To produce the control signal, control circuit 12 produces AM detector transfer function $H_{AM}(f)$ and phase shifter transfer function $H_{PS}(f)$ to determine conjugate filter $H_C(f)$ that is a result of a ratio of AM detector transfer function $H_{AM}(f)$ and phase shifter transfer function $H_{PS}(f)$.

AM detector transfer function $H_{AM}(f)$ is determined from a ratio of the AM noise received by control circuit 12 from AM detector 4 to the PM noise of the oscillator (e.g., oscillator 6 or oscillator 28). Phase shifter transfer function $H_{PS}(f)$ is determined from a ratio of control port 20 of phase shifter 14 to the PM noise of the oscillator (e.g., oscillator 6 or oscillator 28). Accordingly, conjugate filter $H_C(f)$ of the control signal is provided by formula (2).

$$H_C = -\frac{H_{AM}(f)}{H_{PS}(f)} \quad (1)$$

The AM signal is filtered with the conjugate filter $H_C(f)$ and communicated as the control signal to the control port of phase shifter 14.

PM noise reducer 2 has numerous benefits and advantages. PM noise reducer 2 reduces PM noise of an oscillator from determination of the AM noise of the primary oscillator signal instead of referencing the PM noise of the oscillator to a secondary oscillator that is well-characterized and more stable than the oscillator. Further, the primary oscillator signal can have a frequency from 10 kilohertz (kHz) to 3000 terahertz (THz), specifically from 100 kHz to 1000 gigahertz (GHz), and more specifically from 1 megahertz (MHz) to 200 GHz The primary oscillator signal can operate with a carrier power from 1 nanowatt (nW) to 1 megawatts (MW), specifically from 1 microwatts (uW) to 1 killowatts (kW), and more specifically from 1 milliwatt (mW) to 10 watts (MW). The primary oscillator signal can have a duty cycle from 5% to 95%, based on a total on-time of a waveform of the primary oscillator signal. The waveform of the primary oscillator signal can have a shape including square wave, triangular, sawtooth, sinusoidal, asymmetric, and the like. The PM noise of the primary oscillator signal can be from −200 dBrad$^2$/Hz to 100 dBrad$^2$/Hz, specifically from −180 dBrad$^2$/Hz to 40 dBrad$^2$/Hz units, and more specifically from −160 dBrad$^2$/Hz to −50 dBrad$^2$/Hz. The AM noise of the primary oscillator signal can be from −200 dB/Hz to 0 dB/Hz, specifically from −180 dB/Hz to −120 dB/Hz units, and more specifically from −160 dB/Hz to −100 dB/Hz.

Further, the secondary oscillator signal can have a frequency from 10 kHz to 3000 THz, specifically from 100 kHz to 1000 GHz, and more specifically from 1 MHz to 200 GHz. The secondary oscillator signal can operate with a carrier power from 1 nW to 1 MW, specifically from 1 microwatt (μW) to 1 kW, and more specifically from 1 mW to 10 MW. The secondary oscillator signal can have a duty cycle from 5% to 95%, based on a total on-time of a waveform of the secondary oscillator signal. The waveform of the secondary oscillator signal can have a shape including square wave, triangular, sawtooth, sinusoidal, asymmetric, and the like. The PM noise of the secondary oscillator signal can be from −200 dBrad$^2$/Hz to 100 dBrad$^2$/Hz, specifically from −180 dBrad$^2$/Hz to 40 dBrad$^2$/Hz units, and more specifically from −160 dBrad$^2$/Hz to −50 dBrad$^2$/Hz. The AM noise of the primary oscillator signal can be from −200 dB/Hz to 0 dB/Hz, specifically from −180 dB/Hz to −120 dB/Hz units, and more specifically from −160 dB/Hz to −100 dB/Hz.

In comparing the primary oscillator signal provided by the oscillator (e.g., oscillator 6 or oscillator 28) to the secondary oscillator signal, an improvement of the PM noise of the oscillator is improved by greater than 30 decibels (dB), specifically greater than 20 dB, and more specifically greater than 10 dB for a frequency offset with strong correlation between the PM noise and the AM noise and the primary oscillator signal.

Accordingly, rather than correcting the PM noise in the primary oscillator signal from the oscillator by measuring the PM noise in real time, measurement of AM noise is performed with a reference voltage, e.g., a diode and a capacitor in the AM detector rather than a reference oscillator for real-time PM noise determination. Advantageously the AM noise of the oscillator is measured with the AM detector and a control signal of equal magnitude, same frequency response but opposite phase as the PM noise is produced by the control circuit. This control signal is used to reduce the PM noise of the oscillator via the above-described feedforward error correction. Beneficially, PM noise reducer 2 can be used to reduce PM noise of an oscillator to produce the secondary oscillator signal The articles and processes herein are illustrated further by the following Examples, which are non-limiting.

EXAMPLES

Example 1. PM Noise Correlation Without PM Noise Reduction

Figure 11:
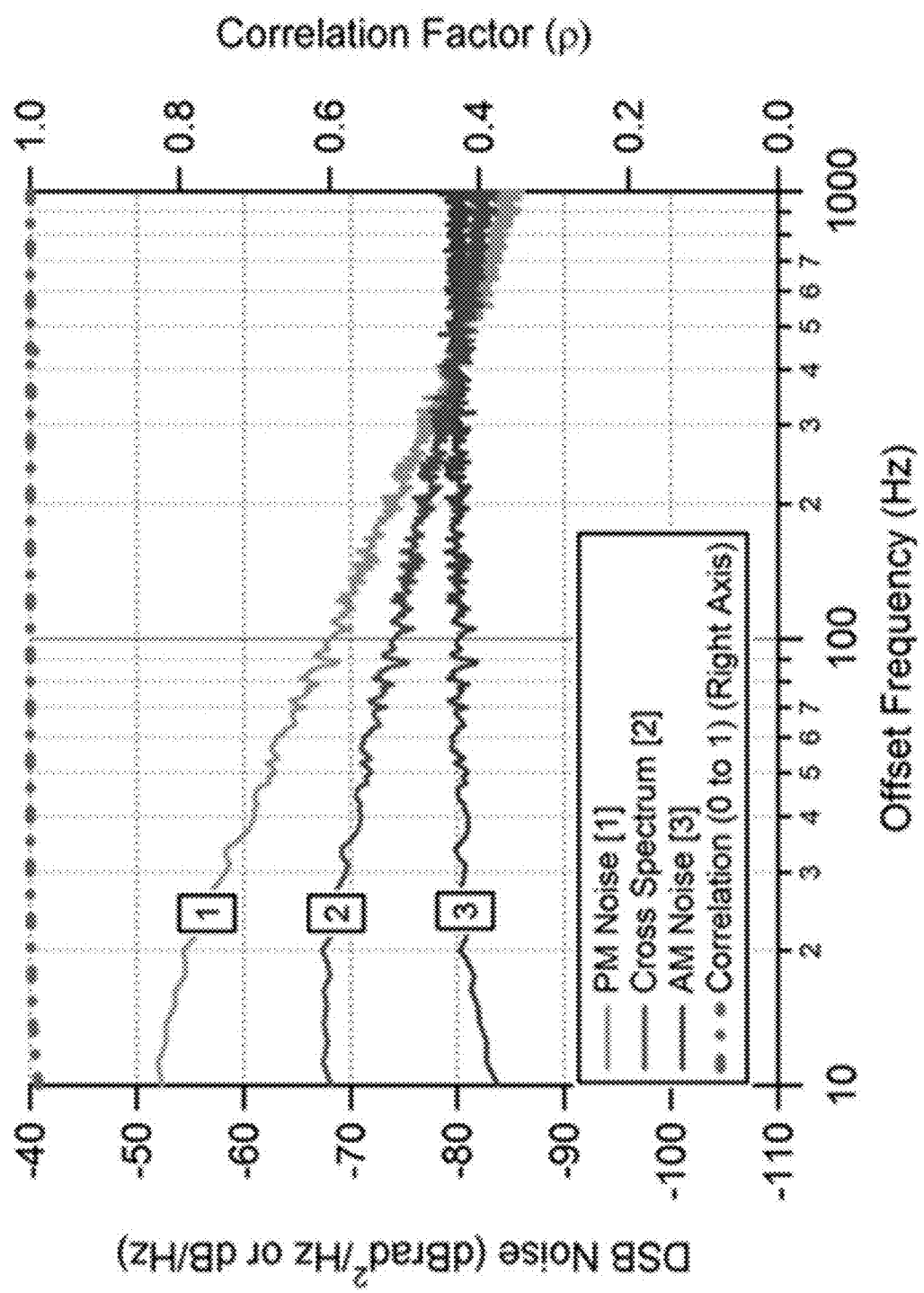
FIG. 11 shows a graph of double side band noise versus offset frequency.

An arbitrary waveform function generator (AWFG, commercially available from Rigol, model DG4160) was connected to a commercial signal generator (commercially available from Agilent, model E8257D). Output from the signal generator was simultaneously FM modulated and AM modulated by the arbitrary waveform function generator to produce nearly 100% correlation. The AM noise spectrum and PM noise spectrum were acquired using an Analog Devices I/Q Demodulator (ADL5387) and a National Instruments dynamic signal analyzer (PXI4461). FIG. 11 shows a graph of double sideband (DSB) noise versus offset frequency for PM noise of the oscillator signal, AM noise, and correlation between the PM noise and the AM noise. A differential slope between the PM noise and the AM noise was $f^{-2}$, and the correlation was nearly 100%.

Example 2. PM Noise Reducer and PM Noise Reduction

The signal generator and AWFG described in Example 1 were connected to a PM noise reducer. The PM noise reducer included a Mini-Circuits power splitter (ZFSC-2-1W), Herotek AM detector (DHM124AA), Stanford Research amplifier (SIM 911), mini-circuits phase shifter (PS, JSPHS-661), National Instruments ADC/DAC (NI 5791), and FPGA processor (NI PXI-7954 R), which were configured as shown in FIG. 2.

Figure 12:
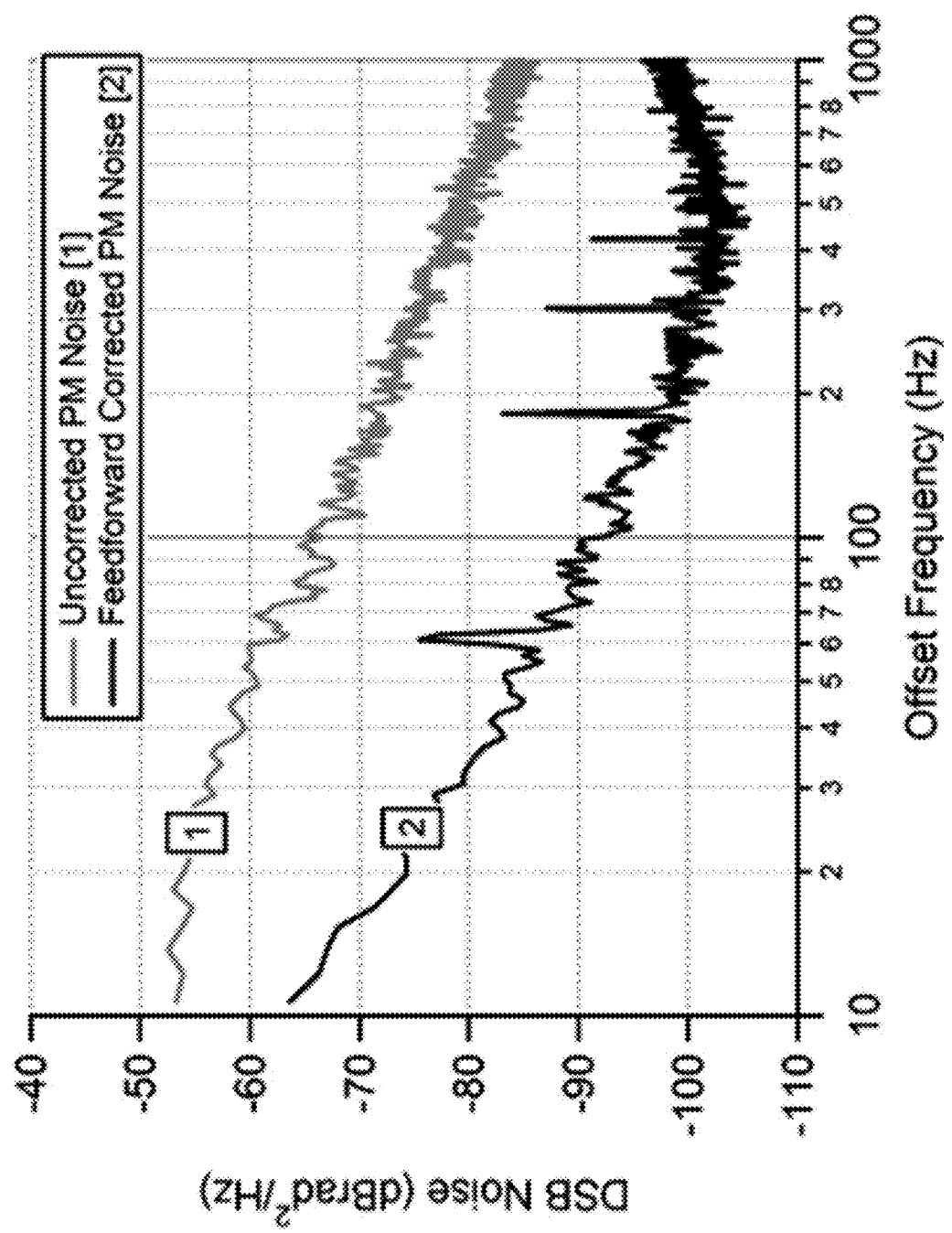
FIG. 12 shows a graph of double side band noise versus offset frequency.

The signal generator was first operated by disabling the control signal to the PS external to the signal generator, and DSB noise as function of offset frequency was acquired. Similarly, the signal generator was operated by enabling the control signal that was generated by measuring two transfer functions $H_{PS}$ and $H_{AM}$, and DSB noise as function of offset frequency was acquired. The transfer functions as well as the AM noise spectrum and PM noise spectrum were acquired by the I/Q Demodulator and a signal analyzer. FIG. 12 shows a graph of double sideband (DSB) noise versus offset frequency for corrected and uncorrected PM noise from the oscillator. An improvement greater than 20 dB over two decades of offset frequencies was observed. Accordingly, when the oscillator exhibited strong correlation between PM and AM noise, the AM noise was used to compensate the PM noise.

Example 3. Quartz MEMS Oscillator

Figure 13:
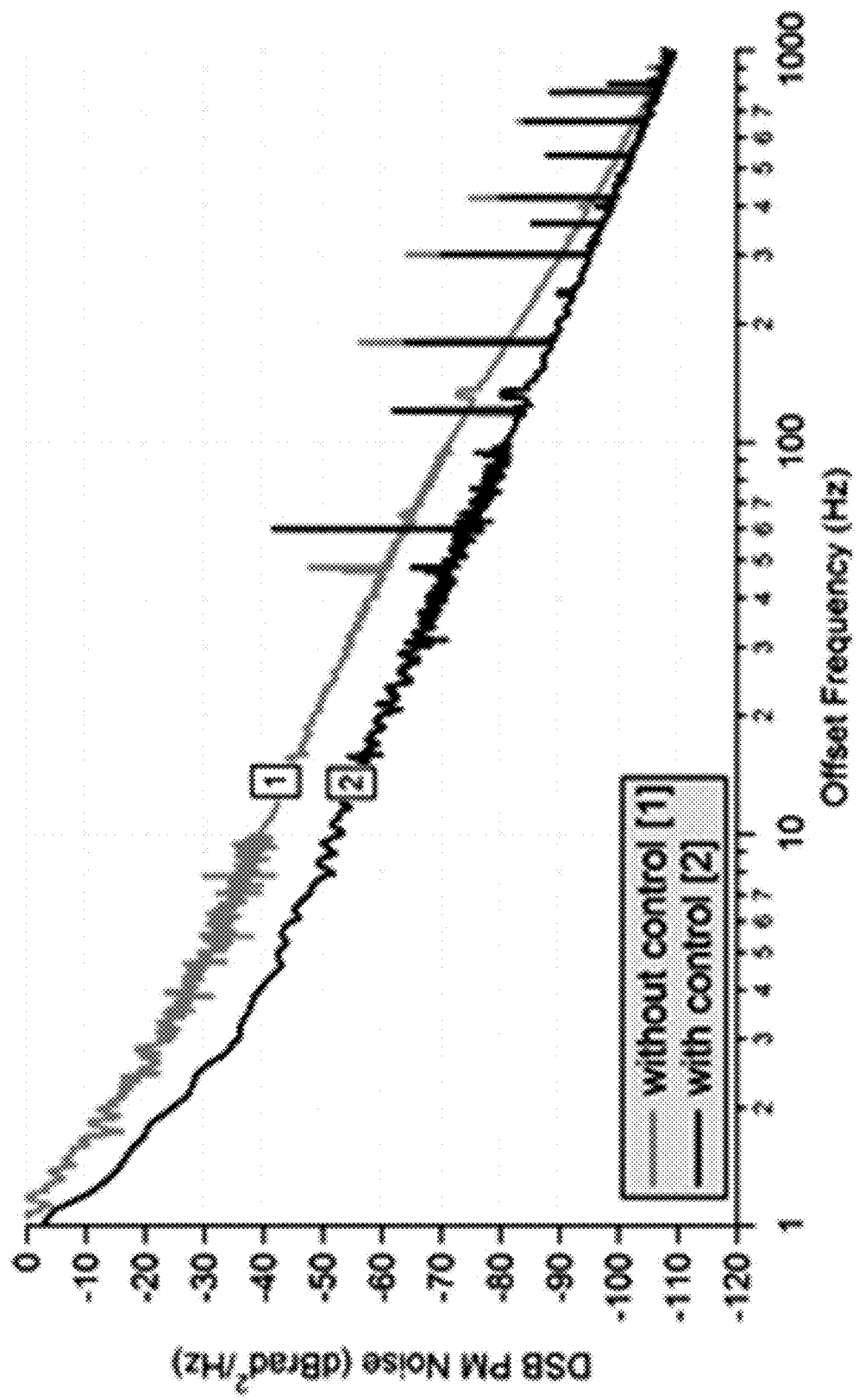
FIG. 13 shows a graph of double side band PM noise versus offset frequency.

An oscillator at 635 MHz was constructed with a custom-built quartz-MEMS resonator and an amplifier (Mini-Circuits ERA-5), configured as shown in FIG. 4. The phase shifter (PS) was disposed inside the loop, and the input and output power of the resonator inside the loop was adjusted using variable attenuators (Hewlett Packard 8494A). The oscillator was connected to the PM noise reducer that included a power splitter (Mini-Circuits ZFSC-2-1W), AM detector (Herotek DHM124AA), amplifier (Stanford Research SIM 911), a phase shifter (Mini-Circuits JSPHS-661), ADC/DAC, (National Instruments NI 5791), and FPGA processors (National Instruments PXI-7954 R). The oscillator was operated by disabling the control signal to the PS, and DSB noise as function of offset frequency was acquired. In a separate experiment, the oscillator was operated by enabling the control signal that was generated by measuring two transfer functions $H_{PS}$ and $H_{AM}$, and DSB noise as function of offset frequency was acquired. FIG. 13 shows a graph of double sideband (DSB) noise versus offset frequency for corrected and uncorrected PM noise from the oscillator. An improvement of 10 dB from 2 Hz to 100 Hz offset frequencies was observed. The oscillator exhibited less than 100% correlation between PM and AM noise, and the AM noise was used to compensate the PM noise.

Example 4. Vibration Testing

Figure 14:
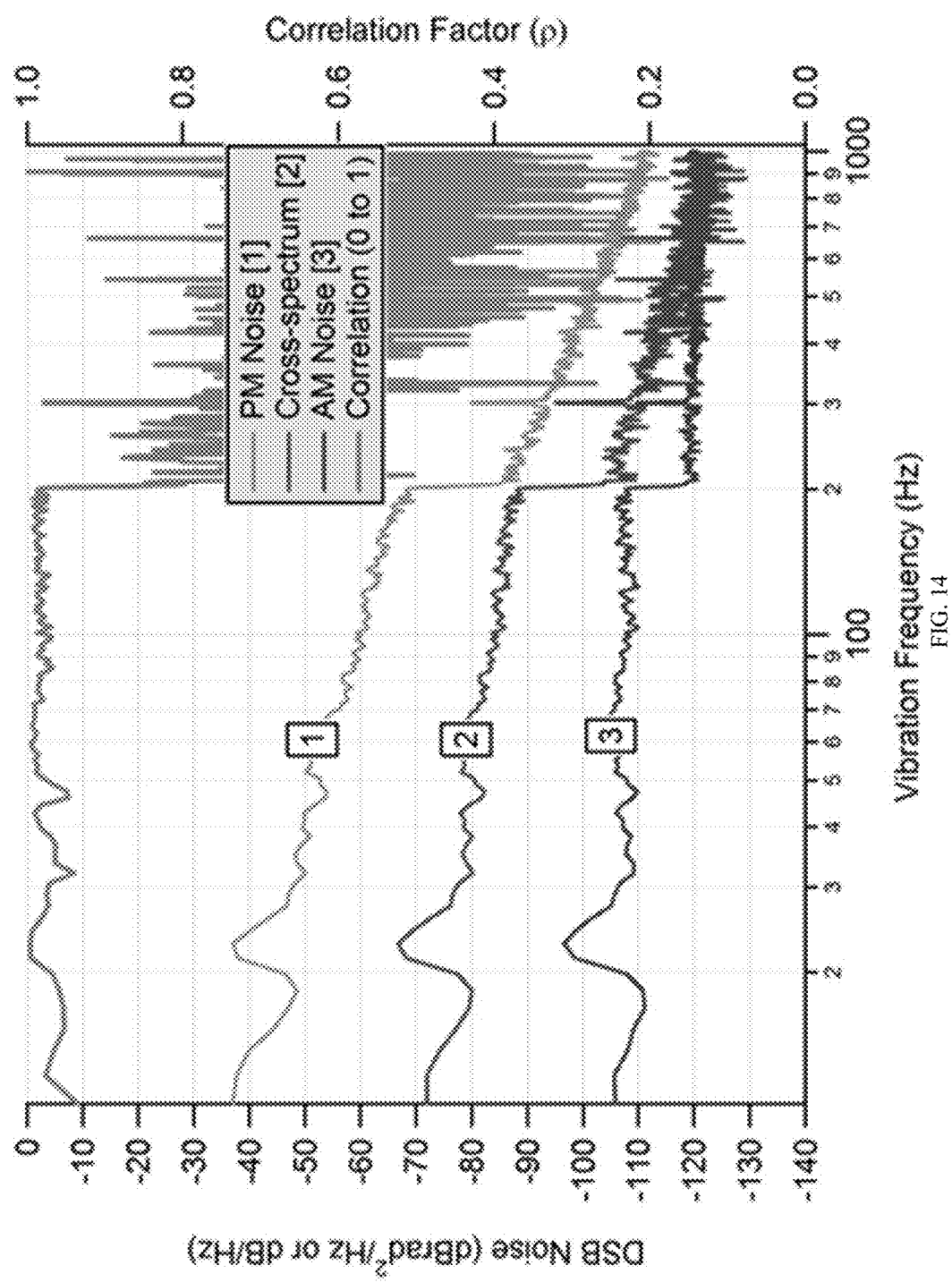
FIG. 14 shows a graph of double side band noise versus vibration frequency.
Figure 15:
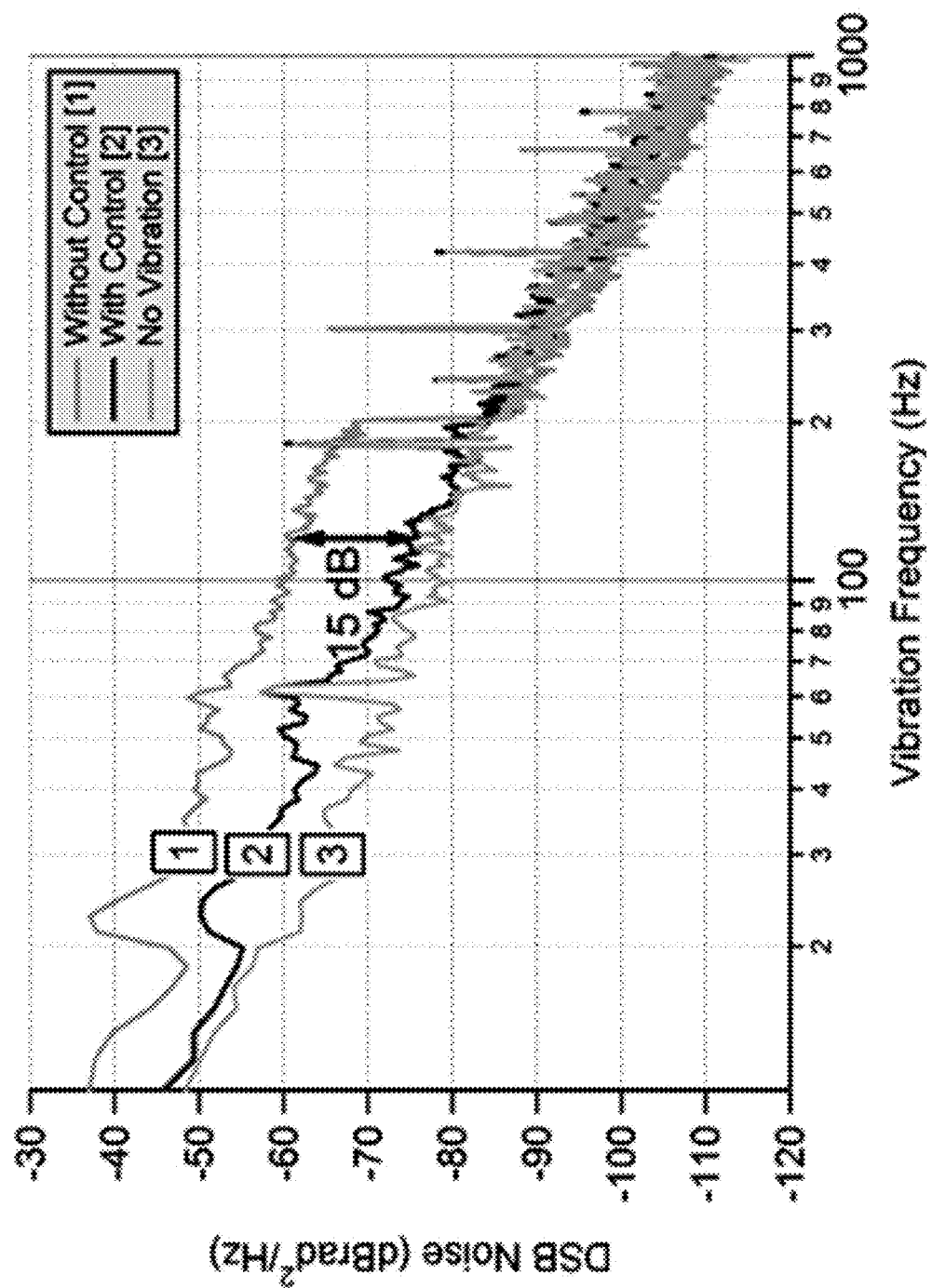
FIG. 15 shows a graph of double side band noise versus vibration frequency.

The oscillator and PM noise reducer described in Example 3 were connected and subjected to vibration testing. The oscillator was mounted on a vibration actuator (Lab Works ET-139) and tested under constant acceleration white noise from 20 Hz to 200 Hz such that an acceleration power spectral density was 0.005 $g^2$/Hz. The oscillator under vibration was operated by disabling the control signal to the PS, and DSB noise as function of offset frequency was acquired as shown in FIG. 14. A differential slope between the PM noise and the AM noise was $f^{-2}$, and the correlation was greater than 90%. This high level of vibration induced correlation was observed in other test oscillators that showed low levels of steady-state correlation. In another test, the oscillator was operated by enabling the control signal that was generated by measuring two transfer functions $H_{PS}$ and $H_{AM}$, and DSB noise as function of offset frequency was acquired. FIG. 15 shows a graph of double sideband (DSB) noise versus offset frequency for corrected and uncorrected PM noise from the oscillator. An improvement of 15 dB from 20 Hz to 200 Hz offset frequencies was observed. PM noise reducer reduced phase noise of the oscillator subjected to vibration and improved its vibration insensitivity.

While one or more embodiments have been shown and described, modifications and substitutions may be made thereto without departing from the spirit and scope of the invention. Accordingly, it is to be understood that the present invention has been described by way of illustrations and not limitation. Embodiments herein can be used independently or can be combined.

Reference throughout this specification to "one embodiment," "particular embodiment," "certain embodiment," "an embodiment," or the like means that a particular feature, structure, or characteristic described in connection with the embodiment is included in at least one embodiment. Thus, appearances of these phrases (e.g., "in one embodiment" or "in an embodiment") throughout this specification are not necessarily all referring to the same embodiment, but may. Furthermore, particular features, structures, or characteristics may be combined in any suitable manner, as would be apparent to one of ordinary skill in the art from this disclosure, in one or more embodiments.

All ranges disclosed herein are inclusive of the endpoints, and the endpoints are independently combinable with each other. The ranges are continuous and thus contain every value and subset thereof in the range. Unless otherwise stated or contextually inapplicable, all percentages, when expressing a quantity, are weight percentages. The suffix "(s)" as used herein is intended to include both the singular and the plural of the term that it modifies, thereby including at least one of that term (e.g., the colorant(s) includes at least one colorants). "Optional" or "optionally" means that the subsequently described event or circumstance can or cannot occur, and that the description includes instances where the event occurs and instances where it does not. As used herein, "combination" is inclusive of blends, mixtures, alloys, reaction products, and the like.

As used herein, "a combination thereof" refers to a combination comprising at least one of the named constituents, components, compounds, or elements, optionally together with one or more of the same class of constituents, components, compounds, or elements.

All references are incorporated herein by reference.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." Further, the conjunction "or" is used to link objects of a list or alternatives and is not disjunctive; rather the elements can be used separately or can be combined together under appropriate circumstances. It should further be noted that the terms "first," "second," "primary," "secondary," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity).

What is claimed is:

1. A phase modulation (PM) noise reducer to reduce phase modulation noise of an oscillator, the PM noise reducer comprising:
    an amplitude modulation (AM) detector to receive a primary oscillator signal and to produce an AM detector signal based on the primary oscillator signal, the primary oscillator signal comprising a first phase modulation (PM) noise, wherein the AM detector comprises:
        a diode in electrical communication with the power splitter to receive the primary oscillator signal from the power splitter; and
        a capacitor in electrical communication with the diode to provide the AM detector signal to the control circuit;
    a control circuit in electrical communication with the AM detector to receive the AM detector signal and to produce a control signal;
    a phase shifter in electrical communication with the control circuit to receive the primary oscillator signal and the control signal and to produce a secondary oscillator signal based on the primary oscillator signal and the control signal, the secondary oscillator signal comprising a second PM noise, wherein the second PM noise is less than the first PM noise; and
    a power splitter in electrical communication with the AM detector and the phase shifter, the power splitter being configured:
        to receive the primary oscillator signal prior to the AM detector and the phase shifter;
        to split a power of the primary oscillator signal; and
        to communicate the primary oscillator signal to the AM detector and to the phase shifter.

2. The PM noise reducer of claim 1, wherein the AM detector further comprises an amplifier in electrical communication with the capacitor and interposed between the capacitor and the control circuit to amplify the AM detector signal.

3. The PM noise reducer of claim 2, further comprising a phase modulation (PM) detector to receive the primary oscillator signal, to produce a PM detector signal in response to receiving the primary oscillator signal, and to communicate the PM detector signal to the control circuit.

4. The PM noise reducer of claim 3, wherein the PM detector comprises:
a local oscillator to produce a local oscillator signal;
a demodulator to receive the primary oscillator signal and the local oscillator signal and to produce a demodulator signal; and
a sampler to receive the demodulator signal from the demodulator and to produce the PM detector signal.

5. The PM noise reducer of claim 4, wherein the control circuit comprises:
an analog-to-digital converter to receive the AM detector signal and the PM detector signal;
a field programmable gate array in electrical communication with the analog-to-digital converter comprising an integrator and a digital filter; and
a digital to analog converter in electrical communication with the field programmable gate array to communicate the control signal to the phase shifter.

6. The PM noise reducer of claim 5, wherein the control circuit is configured to:
produce an AM detector transfer function that is a result of a ratio of the AM detector signal to the PM detector signal;
produce a phase shifter transfer function; and
produce the control signal comprising a conjugate filter that is a result of a ratio of the AM detector transfer function and the phase shifter transfer function.

7. The PM noise reducer of claim 4, wherein the control circuit comprises:
an integrator to receive the AM detector signal and the PM detector signal; and
an analog filter in electrical communication with the integrator to communicate the control signal to the phase shifter.

8. The PM noise reducer of claim 7, wherein the control circuit is configured to:
produce an AM detector transfer function that is a result of a ratio of the AM detector signal to the PM detector signal;
produce a phase shifter transfer function; and
produce the control signal comprising a conjugate filter that is a result of a ratio of the AM detector transfer function and the phase shifter transfer function.

9. A process for reducing a phase modulation noise of an oscillator, the process comprising:
receiving, by an amplitude modulation (AM) detector, a primary oscillator signal from the oscillator, the primary oscillator signal comprising a first phase modulation (PM) noise;
producing, by the AM detector, an AM detector signal based on the primary oscillator signal;
receiving, by a diode of the AM detector, the primary oscillator signal;
providing, by a capacitor of the AM detector, the AM detector signal to a control circuit;
receiving, by a PM detector, the primary oscillator signal from the oscillator;
producing, by the PM detector, a PM detector signal based on the primary oscillator signal;
receiving, by the control circuit, the AM detector signal from the AM detector and the PM detector signal from the PM detector;
producing, by the control circuit:
an AM detector transfer function;
a PM detector transfer function; and
a control signal from the AM detector transfer function and the PM detector transfer function;
receiving, by a phase shifter, the primary oscillator signal and the control signal; and
producing, by the phase shifter, a secondary oscillator signal comprising a second PM noise that is less than the first PM noise to reduce the PM noise of the oscillator;
receiving, by a power splitter, the primary oscillator signal prior to the AM detector and the phase shifter; and
splitting, by the power splitter, a power of the primary oscillator signal and then communicating the primary oscillator signal to the AM detector and to the phase shifter.

* * * * *